United States Patent [19]

Ikeda et al.

[11] Patent Number: 4,803,993
[45] Date of Patent: Feb. 14, 1989

[54] ULTRASONIC DIAGNOSIS APPARATUS

[75] Inventors: Hiroshi Ikeda, Hachioji, Japan; Shinichiro Umemura, Urbana, Ill.; Shizuo Ishikawa, Kanagawa; Kageyoshi Katakura, Tokyo; Noriyoshi Ichikawa, Ibaraki; Tsuyoshi Mitake, Nagareyama, all of Japan

[73] Assignee: Hitachi Medical Corporation, Tokyo, Japan

[21] Appl. No.: 64,564

[22] Filed: Jun. 22, 1987

[30] Foreign Application Priority Data

Jun. 25, 1986 [JP] Japan .................................. 61-146948

[51] Int. Cl.[4] .............................................. A61B 10/00
[52] U.S. Cl. .................................. 128/660.01; 73/602
[58] Field of Search ................... 128/660; 73/620, 602; 367/99-100; 358/37, 96; 382/54

[56] References Cited

U.S. PATENT DOCUMENTS 4,318,413 3/1982 Iinuma et al. ...................... 128/660

FOREIGN PATENT DOCUMENTS 2513461 3/1983 France ................................ 128/660

OTHER PUBLICATIONS

Ophir, J. et al, "Digital Scan Converters in Diagnostic UTS Imaging", Proc. of the IEEE, vol. 67, No. 4 (Apr. 1979), pp. 654–662 only.
Hoshino, H. et al, "Microprogrammable UTS Image Processor and Its Applications to Image Manipulation", SPIE, vol. 314, Dig. Radiog. (1981).
Strum, R. D. et al, "Discrete Systems and Digital Signal Processing", Addison-Wesley Publ. Co., Oct. 1987, pp. 571–577.
Peled, A. et al. "A New Approved to the Realization of Non-Recursive Digital Filters", IEEE publ. AU-21 (6), pp. 477–484 (1973).

Primary Examiner—Francis J. Jaworski
Attorney, Agent, or Firm—Antonelli, Terry & Wands

[57] ABSTRACT

An ultrasonic diagnosis apparatus includes a circuit unit for obtaining an envelope signal of a received ultrasonic signal, an A/D converter for A/D converting the envelope signal, and a circuit unit responsive to the output from the A/D converter for emphasizing the high frequency components of the envelope signal through a digital signal processing.

11 Claims, 6 Drawing Sheets

- •  ···· FILTER TAP
- ⊠  ···· MULTIPLIER
- $Z_i$  ···· DELAY ELEMENT
- Σ  ···· ADDER

ULTRASONIC DIAGNOSIS APPARATUS

BACKGROUND OF THE INVENTION

The present invention relates to an ultrasonic diagnosis apparatus, and more particularly to an ultrasonic diagnosis apparatus provided with a digital signal processor suitable for clearly defining the contour of an ultrasonic image by emphasizing the high frequency components of an envelope signal.

In a conventional circuit for emphasizing the contour as disclosed in JP-A-55-120859, a part of an envelope signal is high-frequency cut and inverted through an inverter amplifier. The obtained signal is added to the original envelope signal to emphasize the high frequency components thereof. Thus, a conventional circuit processes an envelope signal in an analog manner. The circuit arrangement of the analog signal processing method disclosed in JP-A-55-120859 is shown in FIG. 1.

In the Figure, the circuit is constructed of a probe 201, a transmission control circuit 202, a reception control circuit 203, a phase adjustment circuit 204, an amplifier 205, a detector circuit 206, a circuit for emphasizing the high frequency components of an envelope signal (hereinafter called an FTC circuit), an A/D converter 208, a frame memory 209 and an ultrasonic image display unit 210.

In the above circuit arrangement, an ultrasonic signal transmitted from and received to the probe 201 is supplied to the circuit elements 203 to 206 to detect its envelope signal whose high frequency components are emphasized by the FTC (Fast Time Constant) circuit 207. The emphasized signal is converted into a digital signal by the A/D converter 208 to be stored in the frame memory 209. An ultrasonic image is displayed on the ultrasonic display unit 210 in accordance with the information stored in the frame memory 209. As above, the envelope signal processing before the A/D converter 208, particularly at the FTC circuit, is analog. Since the circuit performance varies depending on the dispersion of circuit component tolerances, a fine adjustment requiring considerable work and time is necessary, resulting in high cost. Further, in view of the above circumstances, it is difficult to readily change the circuit performance.

Furthermore, no measure has been proposed against the problem that the circuit performance varies due to the dispersion of circuit component tolerances. For example, there arises a problem that if a plurality of signal processor circuits are used for processing a plurality of received ultrasonic signals, each displayed image may have a nonuniformity in brightness due to a difference in each circuit performance.

SUMMARY OF THE INVENTION

It is an object of the present invention to provide an ultrasonic diagnosis apparatus whose circuits, particularly the circuit emphasizing the high frequency components of an envelope signal, are digitalized to make the circuit performance uniform, reduce the burden of circuit adjustment, and readily change the circuit performance.

The above object is achieved by the circuit construction wherein a digitalized envelope signal is processed by a digital filter to emphasize the high frequency components, i.e., the contour of an ultrasonic image.

In processing a digital envelope signal by the digital filter, the filter coefficient and order used as processing parameters can be supplied in the form of binary data. Further, the window width on the time axis for the filter process can be changed easily. The same parameter for a plurality of circuits may be given using a digital value at the same time, thereby reducing the burden of circuit adjustment and realizing an easy change in circuit performance.

BRIEF DESCRIPTION OF THE DRAWINGS

FIG. 5 show a relationship between window width on the time axis and the emphasis factor for the processing by the digital filter, wherein

DESCRIPTION OF THE PREFERRED EMBODIMENTS

The embodiments of the present invention will be described in detail with reference to the accompanying drawings.

Figure 1:
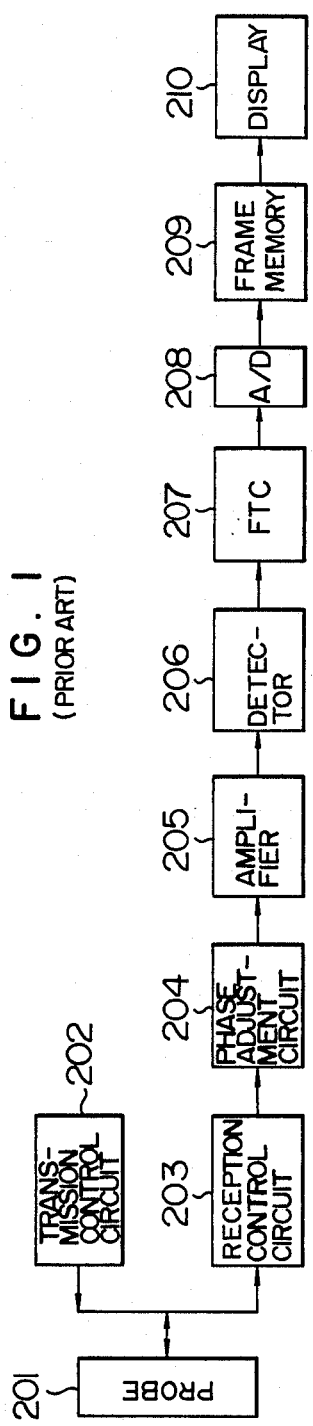
FIG. 1 is a circuit diagram in block form showing a conventional ultrasonic diagnosis apparatus.
Figure 2:
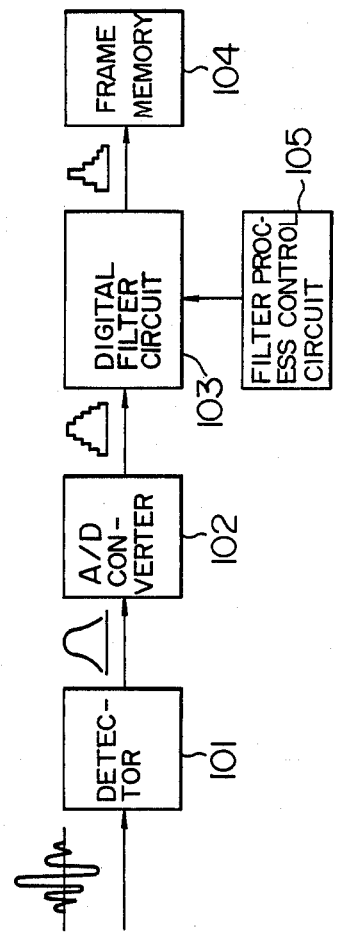
FIG. 2 is a circuit diagram in block form showing the main part of an embodiment of the ultrasonic diagnosis apparatus according to the present invention.

FIG. 2 shows a basic circuit arrangement of an embodiment of the ultrasonic diagnosis apparatus according to the present invention.

Referring to FIG. 2, the basic circuit arrangement is constructed of a detector 101, an A/D converter 102, a digital filter circuit 103, a frame memory 104, and a filter process control circuit 105.

In the above basic circuit, an envelope signal detected by the detector 101 is converted by the A/D converter 102 into a digital signal which is inputted to the digital filter circuit 103. The coefficient, order, window width of the time axis for filter process and so on of the digital filter circuit 103 are controlled through the filter process control circuit 105. The digital filter circuit 103 performs a filter process for emphasizing the high frequency components of an envelope signal, the output from the digital filter circuit being stored in the frame memory 104.

Figure 3:
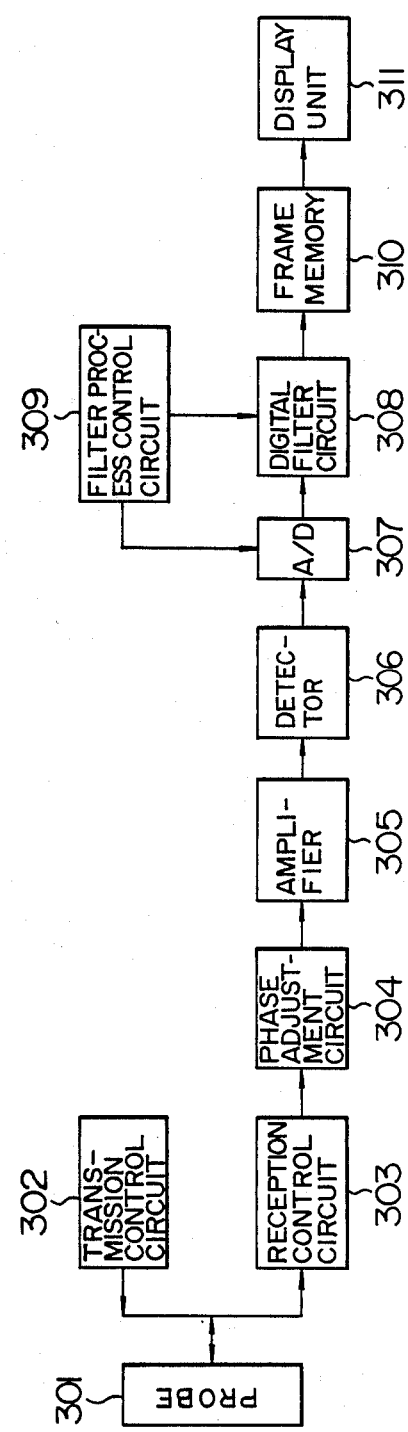
FIG. 3 is a circuit diagram in block form showing an embodiment of the ultrasonic diagnosis apparatus according to the present invention.

FIG. 3 shows the circuit arrangement of an embodiment of the ultrasonic diagnosis apparatus according to the present invention. The ultrasonic diagnosis apparatus shown in FIG. 3 is constructed of a probe 301, a transmission control circuit 302, a reception control circuit 303, a phase adjustment circuit 304, an amplifier 305, a detector 306, an A/D converter 307, a digital filter 308, a filter process control circuit 309, a frame memory 310 and an ultrasonic image display unit 311.

Figure 4:
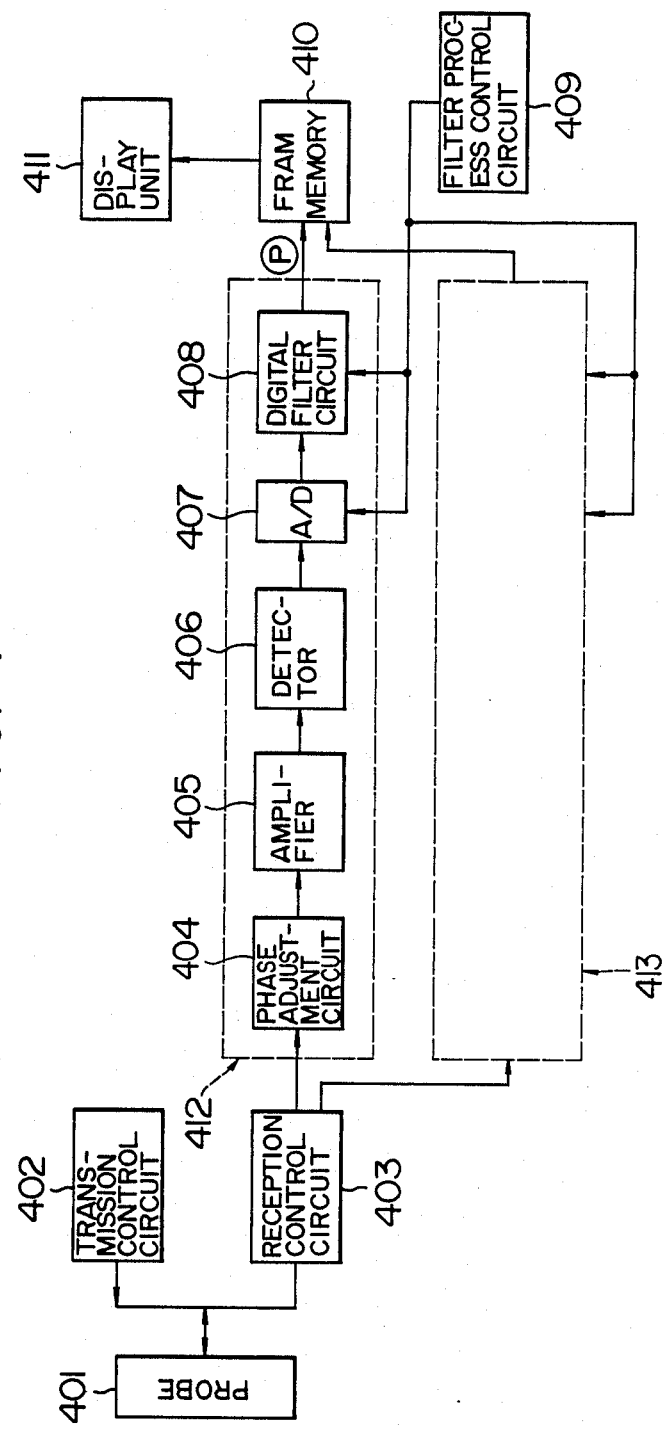
FIG. 4 is a block diagram showing an embodiment of the ultrasonic diagnosis apparatus having a plurality of signal processor circuits according to the present invention.

FIG. 4 shows an ultrasonic diagnosis apparatus having two signal processor circuits each constructed of circuit elements 304 to 308 shown in FIG. 3, whereby two ultrasonic image signals from reception control circuit 403 are inputted and processed at the same time.

The ultrasonic diagnosis apparatus shown in FIG. 4 is constructed of a probe 401, a transmission control circuit 402, a reception control circuit 403, two circuit blocks 412 and 413, a filter process control circuit 409, a frame memory 410 and an ultrasonic image display device 411. The circuit block 412 includes a phase adjustment circuit 404, an amplifier 405, a detector 406, an A/D converter 407, and a digital filter circuit 408. The circuit block 413 is constructed in a similar manner to the circuit block 412. These two circuit blocks process two signals from reception control circuit 403 at the same time to write processed signals in the frame memory 410. The filter process control circuit 409 designates parameters for filter process by the two circuit blocks.

With the circuit arrangement shown in FIGS. 3 and 4, it is possible to designate each parameter used for the filter process, such as a digital filter coefficient, order and the like, in the form of binary data, thus resulting in considerably reduced circuit adjustment work. Further, it is possible for the operator to change the circuit performance as desired and obtain an ultrasonic image different in quality depending on the diagnostic portion or symptom.

The circuit arrangement of the present invention shown in FIG. 4 is particularly advantageous in that parameters for filter process used for the two circuit blocks can be designated using the single filter process control circuit at the same time, and in that nonuniformity in image intensity caused by the dispersion of the circuit performance of the two circuit blocks or the like can be eliminated.

The embodiment of FIG. 4 shows a case where the two circuit blocks are provided. However, the present invention is not limited to the embodiment having the two circuit blocks but is also applicable to a case having more than two circuit blocks or where plural receiving signals are processed in a time-sharing manner irrespective of the number of the circuit blocks.

FIG. 5 shows examples of a relationship between the window width on the time axis for the filter process by the digital filter circuit and the emphasis factor (frequency response).

In FIG. 5, $h_1$ to $h_n$ represent filter coefficients, T represents a data transfer period at each input tap of the digital filter. $T_o$ represents a window width on the time axis for the filter process, the window width $T_o$ being equal to the time required for data to be transferred from the first tap x to the n th tap $x_n$ assuming the filter order is n, i.e., $T_o$ being equal to the sum of delay times $t_1$ to $t_{n-1}$ of each delay element. f represents a highest frequency of an envelope signal.

Figure 5A:
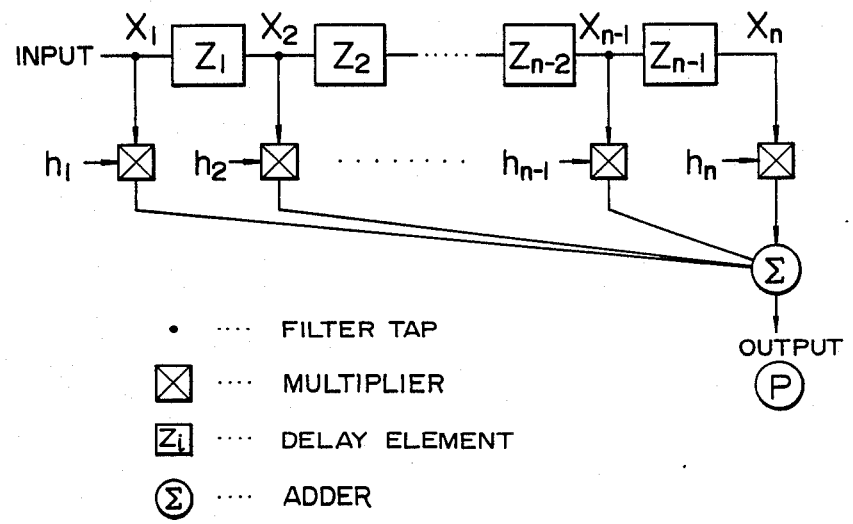
FIG. 5A shows a relationship between the delay element of the digital filter and the filter coefficients.
Figure 5B:
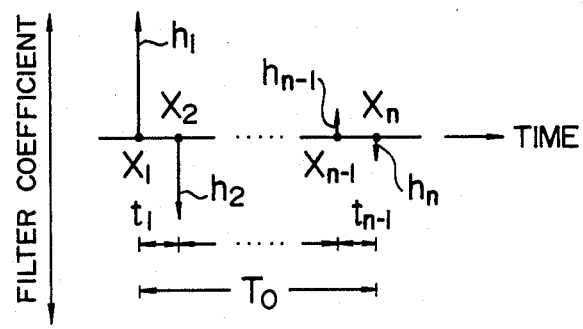
FIGS. 5B and 5C illustrate the filter coefficients relative to the window width $T_o$ on the time axis.
Figure 5C:
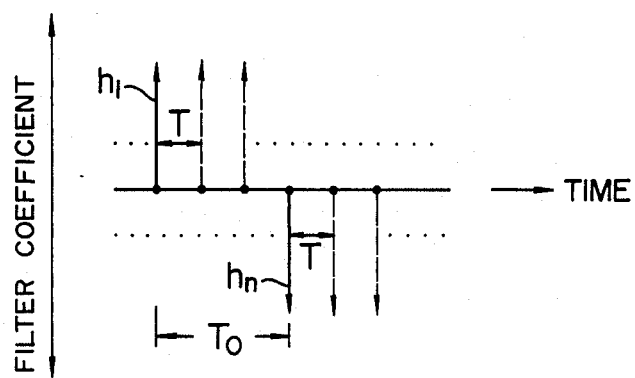
Figure 5D:
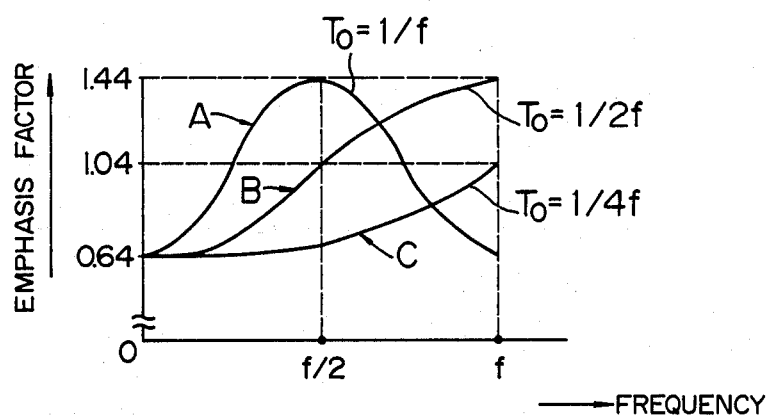
FIG. 5D shows a relationship between the emphasis factor (amplitude ratio) and the frequency.

FIG. 5A shows an example of a digital filter circuit, FIG. 5B illustrates a window width $T_o$ on the time axis, FIG. 5C shows a relationship between filter coefficients in real space, and FIG. 5D shows a relationship between the emphasis factor and the frequency in a frequency space.

Generally, the frequency response for the filter process can be understood through Fourier transformation of the associated relationship in real space. The following equation (1) is obtained through Fourier transformation of the relationship shown in FIG. 5C.

$$F(jw) = h_1 - h_n e^{-jwT_o} \quad (1)$$

wherein $w = 2\pi f$.

The influence of the change in a window width $T_o$ on the time axis for the filter process upon the emphasis factor depends on its relative value. Thus, to simplify the discussion, the absolute square of the above equation (1) is introduced which is given by:

$$|F(jw)|^2 = (h_1^2 + h_n^2) - 2h_1 h_n \cos(wT_o) \quad (2)$$

FIG. 5D shows the results of the equation (2) assuming that $h_1 = 1$, $h_n = -0.2$, $T_o = 1/f$, $\frac{1}{2}f$ and $\frac{1}{4}f$. As seen from FIG. 5D, in the case of a window width $T_o = \frac{1}{4}f$ on the time axis for a filter process, the change in emphasis factor is maximum at about the highest frequency f of an envelope signal. In case of a window width $T_o = 1/f$ (curve A), since the emphasis factor at about half the highest frequency f is maximum, the contour of an ultrasonic image is not effectively improved. At a window width $T_o = \frac{1}{2}f$ on the time axis for a filter process, the emphasis factor becomes maximum relative to that at a lowest frequency. As the window width becomes greater than $T_o = \frac{1}{2}f$, the emphasizing effect becomes smaller. Consequently, the window width $T_o$ on the time axis for filter process should be set lower than half the envelope signal period (1/f). The contour is gradually emphasized toward the highest frequency f in case of curve B ($T_o = \frac{1}{2}f$) of FIG. 5D, whereas in case of curve C ($T_o = \frac{1}{4}f$), the contour is emphasized only at the frequency f which is suitable for emphasizing the contour of an image.

The second order digital filter has been described in FIGS. 5C and 5D. However, the effect of this invention is not attributable only to such digital filters, but can be obtained also in case of digital filters having a filter coefficient and an order specific to the above described emphasis factor. Further, in the ultrasonic signal processing, an envelope signal of an ultrasonic signal is asymmetric relative to a time when the envelope signal has its maximum amplitude. Therefore, according to the main features of the present invention, the arrangement of filter coefficients are asymmetric in the direction of the time axis as shown in FIG. 5B, and the sign of filter coefficients are changed alternately for each odd and even number.

Furthermore, use of the window width on the time axis for the filter process, or filter coefficients and their arrangement of this embodiment advantageously reduces the filter order of hardware while emphasizing the high frequency components.

Figure 6:
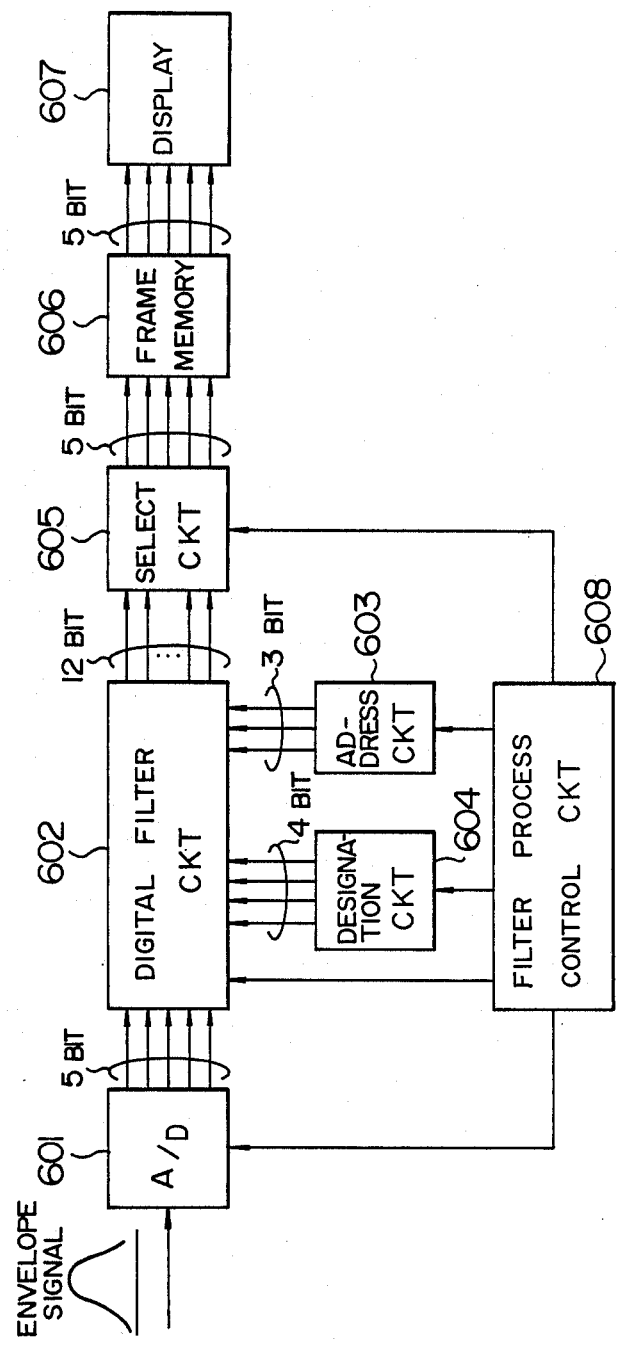
FIG. 6 is a block diagram illustrating the circuit arrangement with which the resolving power of the A/D converter is made equal to the intensity resolving power of the ultrasonic display unit.

FIG. 6 shows a circuit arrangement of an embodiment of the ultrasonic diagnosis apparatus wherein the resolving power of an A/D converter is made equal to the intensity resolving power of an ultrasonic image display unit.

The ultrasonic diagnosis apparatus shown in FIG. 6 is constructed of an A/D converter 601, a digital filter 602, an address designation circuit 603 for designating an address of a filter order of the digital filter, a designation circuit 604 for designating a filter coefficient of the digital filter, a bit select circuit 605 for selecting a signal effective for displaying an image from the outputs of the digital filter, a frame memory 606, an ultrasonic image display unit 607, and a filter process control circuit 608 for controlling the circuit elements 601 to 605.

Assume that the intensity resolving power of the ultrasonic image display unit 607 is 5 bits (i.e., 32 half tones). To utilize a maximum of the display capability of the display unit 607, the A/D converter before the filter process is required to have at least a 5 bit resolving power. This is clearly understood from the following example. Namely, if an A/D converter with a 4 bit resolving power produces a maximum output signal "1111", the digital filter 602 with the filter order of 1 and filter coefficients of 1000 outputs a signal "000001111000". In this case, it is apparent that the maximum display capability of the display unit 607 is not effectively utilized even if the bit select circuit 605 selects any optional 5 bits among the output signal of the filter.

In the above description of the example shown in FIG. 6, the resolving power of the A/D converter is made equal to the intensity resolving power of the ultrasonic image display unit. However, the invention is not intended to be limited thereto, but obviously the invention is applicable to the case where the resolving power of the A/D converter is made higher than the intensity resolving power of the ultrasonic image display unit.

In the above description of the embodiments, the circuit arrangement of A/D converting an output from a detector is employed. However, the present invention is not limited thereto. For instance, the circuit arrangement including a digital detector will fall within the scope of this invention, the circuit arrangement using, instead of the circuit elements 306 and 307 in FIG. 3, a high speed A/D converter for A/D converting a phase adjusted ultrasonic signal and a quadrature detector for sampling a line segment of an envelope line of the digitalized signal.

As seen from the foregoing description of the present invention, the nonuniformity of the circuit performance caused by the dispersion of component tolerances, which has been a problem associated with a conventional analog signal processing method, can be eliminated. Therefore, it is advantageous in that the time required for circuit adjustment can be reduced and hence the work cost can be reduced.

Further, use of a digital circuit enables an easy change in quality of an ultrasonic image to be displayed.

We claim:

1. An ultrasonic diagnosis apparatus comprising:
   an ultrasonic probe for transmitting and receiving ultrasonic signals;
   means for controlling the transmission of said ultrasonic signals by said ultrasonic probe;
   means for controlling the reception of said ultrasonic signals by said ultrasonic probe;
   n signal processing circuits (n≧2) each of which includes,
      means for selecting one beam out of received signals received by said reception controlling means;
      means for providing an envelope signal of said one beam;
      means for converting said envelope signal from an analog signal to a digital signal; and
      means for digitally filtering and emphasizing high frequency components of said digital signal;
   means for changing filtering characteristics of said digitally filtering and emphasizing means by controlling said converting means and said digitally filtering and emphasizing means;
   means for storing an output signal from said digitally filtering and emphasizing means; and
   a display for displaying the stored output signal stored in said storing means as an image,
   wherein said n signal processing circuits have the same filtering characteristics set by said changing means so to select n beams.

2. An ultrasonic diagnosis apparatus according to claim 1, wherein said converting means and said digitally filtering and emphasizing means are controlled externally through said filtering characteristics changing means.

3. An ultrasonic diagnosis apparatus according to claim 2, further comprising:
   a bit selecting means for selecting n sequential bits from m bits of said output signal of said digitally filtering and emphasizing (m>n) means, and applying said selected n-bits to said storing means.

4. An ultrasonic diagnosis apparatus according to claim 1, further comprising:
   a bit selecting means for selecting n sequential bits from m bits of said output signal of said digitally filtering and emphasizing (m>n) means, and applying said selected n-bits to said storing means.

5. An ultrasonic diagnosis apparatus according to claim 1, wherein a window width on a time axis for a filter process by said digitally filtering and emphasizing means is set shorter than one-half the highest frequency of said envelope signal.

6. An ultrasonic diagnosis apparatus according to claim 1, wherein a plurality of filter coefficients for a filter process performed by said digitally filtering and emphasizing means are arranged asymmetrical on a time axis.

7. An ultrasonic diagnosis apparatus comprising:
   an ultrasonic probe for transmitting and receiving ultrasonic signals;
   means for controlling the transmission of said ultrasonic signals by said ultrasonic probe;
   means for controlling the reception of said ultrasonic signals by said ultrasonic probe;
   means for selecting one beam out of the received signals received by said controlling means;
   means for providing an envelope signal of said selected beam;
   means for converting said envelope signal from an analog signal to a digital signal;
   means for digitally filtering and emphasizing high frequency components of said digital signal;
   means for changing filtering characteristics of said digitally filtering and emphasizing means by controlling said converting means and said digitally filtering and emphasizing means;
   means for storing an output signal from said digitally filtering and emphasizing means; and
   a display for displaying the stored output signal stored in said storing means as an image,
   wherein said digitally filtering and emphasizing means has two filtering characteristics having two weight coefficients (1 and about −0.2), and wherein said converting means and said digitally filtering and emphasizing means operate under a clock signal having $\frac{1}{2}$-$\frac{1}{4}$ periods of the maximum frequency components of said envelope signal.

8. An ultrasonic diagnosis apparatus according to claim 7, wherein said converting means and said digitally filtering and emphasizing means are controlled externally through said filtering characteristics changing means.

9. An ultrasonic diagnosis apparatus according to claim 8, further comprising:
a bit selecting means for selecting n sequential bits from m bits of said output signal of said digitally filtering and emphasizing (m>n) means, and applying said selected n-bits to said storing means.

10. An ultrasonic diagnosis apparatus according to claim 8, wherein the resolving power of said converter means is higher than an intensity resolving power of said display.

11. An ultrasonic diagnosis apparatus according to claim 7, further comprising:
a bit selecting means for selecting n sequential bits from m bits of said output signal of said digitally filtering and emphasizing (m>n) means, and applying said selected n-bits to said storing means.

* * * * *